United States Patent
Lin et al.

(10) Patent No.: US 6,285,224 B1
(45) Date of Patent: Sep. 4, 2001

(54) LOW FREQUENCY CLOCK FEED-THROUGH CHARGE PUMP CIRCUIT

(75) Inventors: Jyhfong Lin; Chan-Hsiang Hsu, both of Taipei (TW)

(73) Assignee: Via Technologies, Inc., Taipei Hsien (TW)

( * ) Notice: Subject to any disclaimer, the term of this patent is extended or adjusted under 35 U.S.C. 154(b) by 0 days.

(21) Appl. No.: 09/560,580

(22) Filed: Apr. 28, 2000

(30) Foreign Application Priority Data

Aug. 3, 1999 (TW) ................................................ 088113215

(51) Int. Cl.$^7$ ........................................................ G05F 1/10

(52) U.S. Cl. ............................................ 327/157; 327/536

(58) Field of Search ..................................... 327/157, 156, 327/536, 147, 148, 535, 437

(56) References Cited

U.S. PATENT DOCUMENTS 5,801,578 * 9/1998 Bereza .................................. 327/157

\* cited by examiner

Primary Examiner—Dinh T. Le
(74) Attorney, Agent, or Firm—Jiawei Huang; J. C. Patents

(57) ABSTRACT

A low clock feed through charge pump circuit applied in a phase includes a first pump transistor, a second pump transistor, a first switch device, a second switch device, a third switch device, a fourth switch device, a first wide-swing current mirror circuit and a second wide-swing current mirror circuit. Each of the first and second wide-swing current mirror circuits consists of four cascode transistor circuits and a bias circuit for providing a bias required by the low clock feed through charge pump circuit. The transistors forming the four switch devices and the four cascode transistor circuits operates in the saturation region. With the low clock through charge pump circuit, charge injection and jitter can be reduced.

25 Claims, 2 Drawing Sheets

LOW FREQUENCY CLOCK FEED-THROUGH CHARGE PUMP CIRCUIT

CROSS-REFERENCE TO RELATED APPLICATION

This application claims the priority benefit of Taiwan application serial no. 88113215, filed Aug. 3, 1999.

BACKGROUND OF THE INVENTION

1. Field of the Invention

The invention relates to a phase locked loop (PLL) circuit, and in particular to a charge pump circuit in a phase locked loop circuit.

2. Description of the Related Art

In line with the great progress in semiconductor technology, the operating speed of contemporary computers is getting increasingly fast. However, higher operating frequency causes more power consumption. In order to reduce the unnecessary power consumption, it is designed to reduce the operating voltage of computers from 5V to 3.3V, then further to 2.5V, even to less than 2.0V. In coordination with the decrease of operating voltage, it is necessary to modify a great number of circuits, such as an oscillator for providing a clock signal. In a current computer system, there is simultaneously a variety of clock frequencies. Generally, a phase locked loop circuit is used to generate a number of clock signals with different proportional frequencies on with respect to a reference clock signal for the uses of a plurality of sub-systems. Moreover, a voltage control oscillator is a main factor to affect the performance of the phase locked loop circuit. And, the performance of the voltage control oscillator depends on its own long term jitter and short term jitter and the variation of a power supply voltage.

FIG. 1 is a block circuit diagram showing a conventional phase locked loop circuit. Referring to FIG. 1, a phase locked loop circuit includes a phase detector 10, a charge pump 12, a lowpass filter (LPF) 14 and a voltage control oscillator (VCO) 16. In general, the less the fluctuation of the input voltage signal of the voltage control oscillator 16, the less the jitter of the output voltage. As a result, the phase locked loop circuit can have an output voltage with a stable frequency. To minimize the fluctuation of the voltage signal input to the voltage control oscillator 16, it is necessary to make two current sources located in the charge pump 12 have the same current flow.

FIG. 2 is a circuit diagram showing the charge pump 12 of FIG. 1. Referring to FIG. 2, switches SW1, $\overline{SW1}$, SW2, $\overline{SW2}$ consist of transistors which all operate in a linear region. When each transistor is turned off from an on-state, charges stored on the drain must be released, causing charge injection. The less the charges stored on the drain, the less the effect of the charge injection. As a result, the control voltage of the VCO 16 almost remains unchanged. Since the $\overline{SW1}$ and $\overline{SW2}$ operate in the linear region, charges are accumulated in their channels between on-state and off-state thereof. Most charges stored around the drain can be released, resulting in an effect on the output voltage.

A current is mirrored into a transistor T2 and a current source I2 by a transistor Q. Therefore, if the voltage on a node P3 is equal to that on a node P4, it can make the current source I2 have the same current flow as the transistor T2. Assume that the voltage on the node P4 is at a certain constant value. If the voltage on the node P3 is larger than that on the P4, the current I1 is slightly larger than the current I2 as a result of channel modulation. Nevertheless, the voltage on a node P2 must be larger than the voltage on the node P4. Since the gate and the drain of the transistor T1 are electrically coupled to each other to form a diode, it makes the transistor T1 have a current flow different from the transistor T2 if the voltage of the node P2 is equal to the voltage of the node P4. In addition, since the current of a current source I3 is mirrored by the transistor T1, the current source I3 has the same current flow as the transistor T1. As a whole, the current flows of the current source I2 and current source I3 are different in value. Typically, the current source I3 has a larger current flow than the current source I2. If the difference of the current flows of the current sources I2, I3 is larger, the fluctuation of the voltage becomes much larger. As a result, the jitter of the output voltage of the voltage control oscillator 14 becomes more serious.

Moreover, since the transistors operating in the linear region can be considered as resistors, the voltage variation of the output points will affect the nodes P1, P4 so as to change the values of the I2 and I3.

SUMMARY OF THE INVENTION

In view of the above, an object of the invention is to provide a low clock feed through charge pump circuit which includes a plurality of switch transistors, wherein the transistors all operate in a saturation region to thereby prevent charge injection occurring on the switch transistors of the charge pump circuit.

Another object of the invention is to provide a low clock feed through charge pump circuit which can greatly reduce the fluctuation of a signal input to a voltage control oscillator, thereby lowering the jitter of the output signal of the voltage control oscillator and stabilizing the frequency of the output signal of the phase locked loop circuit.

The low clock feed through charge pump circuit of the invention includes a first pump transistor, a second pump transistor, a first switch device, a second switch device, a third switch device, a fourth switch device, a first cascode transistor circuit, a second cascode transistor circuit, a third cascode transistor circuit, a fourth cascode transistor, a first wide-swing current mirror and a second wide-swing current mirror. The source of the first pump transistor is electrically coupled to a power supply while the source of the second pump transistor is electrically coupled to ground, wherein the first pump transistor and the second pump transistor each serves as a current source. Each of the first switch device, the second switch device, the third switch device and the fourth switch device has a first terminal, a second terminal and a third terminal. The first terminals of the first switch device and the second switch device are electrically coupled to the drain of the first pump transistor. The second terminals of the third switch device and the fourth switch device are electrically coupled to the drain of the second pump transistor. The second terminals of the first switch device and the second switch device are electrically coupled to the first terminals of the third switch device and the fourth switch device, respectively. The third terminals of the first switch device and the second switch device are electrically coupled to each other while the third terminals of the third switch device and the fourth switch device are electrically coupled to each other. The two wide-swing current mirrors are used to provide a bias required by the low clock feed through pump circuit and have a more precise current generated than a conventional bias circuit and a low voltage source than a general cascode current mirror. The first wide-swing current mirror , mainly a cascode transistor circuit, is electrically coupled between the power supply and ground and consists of two transistors, wherein the first transistor has its gate electrically coupled to the third terminal of the first switch device and the second transistor has its gate electrically coupled to the gate of the first pump transistor and the drain of the first transistor. The second wide-swing current mirror, mainly a cascode transistor circuit, consists of two transistors, wherein the first has its gate electrically coupled to the third of the fourth switch device and the other has its gate electrically coupled to the gate of the second pump transistor and the drain of the first transistor. The second wide-swing current mirror also provides the first wide-swing current mirror a required bias current. An input current is electrically coupled to the drain of the first transistor and the gate of the second transistor of the second wide-swing current mirror, thereby providing the low clock feed through pump circuit an input current.

The transistors of the first and second wide-swing current mirrors all operate in the saturation region, making the first and second pump transistors have the same current flow. Furthermore, the transistors of the first, second, third and fourth switch devices all operate in the saturation region. Accordingly, the low clock feed through charge pump circuit according to the invention can greatly reduce the fluctuation of a signal input to a voltage control oscillator, thereby lowering the jitter of the output signal of the voltage control oscillator and stabilizing the frequency of the output signal of the phase locked loop circuit.

BRIEF DESCRIPTION OF THE DRAWINGS

The invention will be more fully understood from the detailed description given hereinbelow and the accompanying drawings which are given by way of illustration only, and thus do not limit the present invention, wherein.

DETAILED DESCRIPTION OF THE PREFERRED EMBODIMENT

Figure 1:
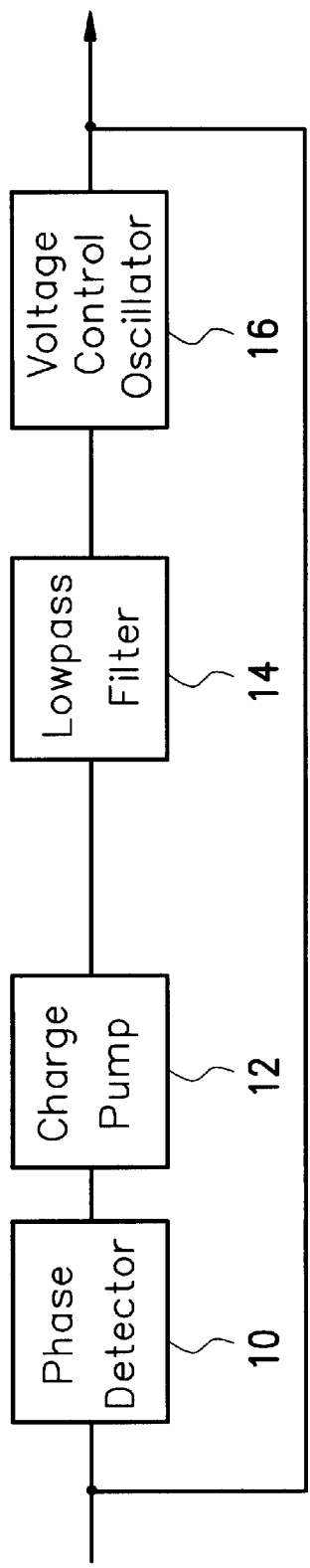
FIG. 1 is a block circuit diagram showing a phase locked loop circuit.
Figure 2:
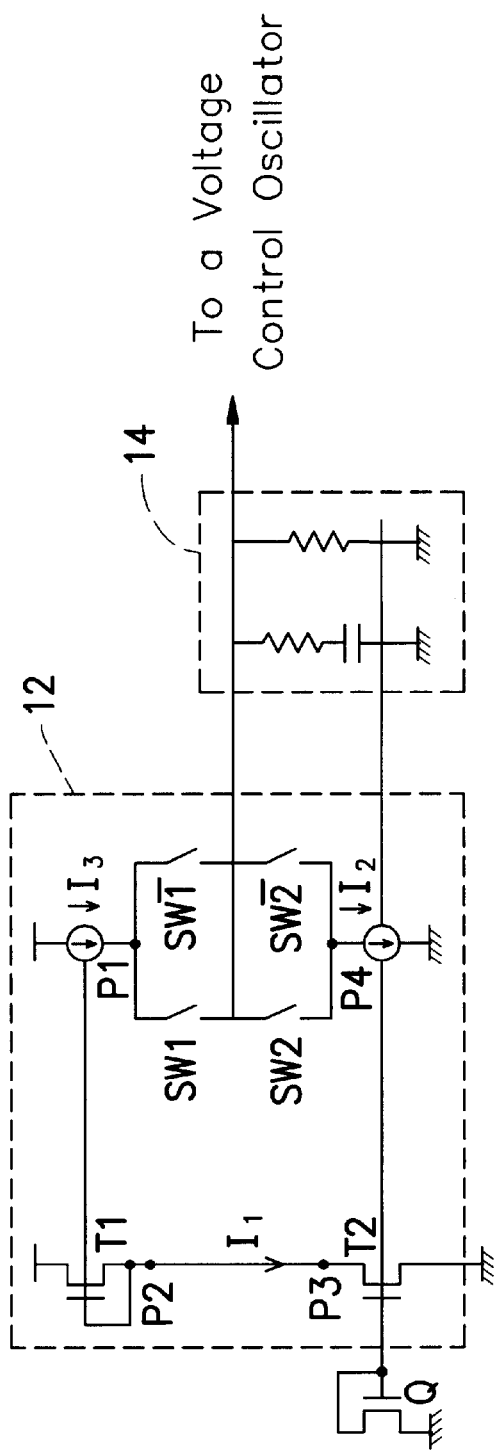
FIG. 2 is a circuit diagram showing a charge pump circuit according to the prior art.
Figure 3:
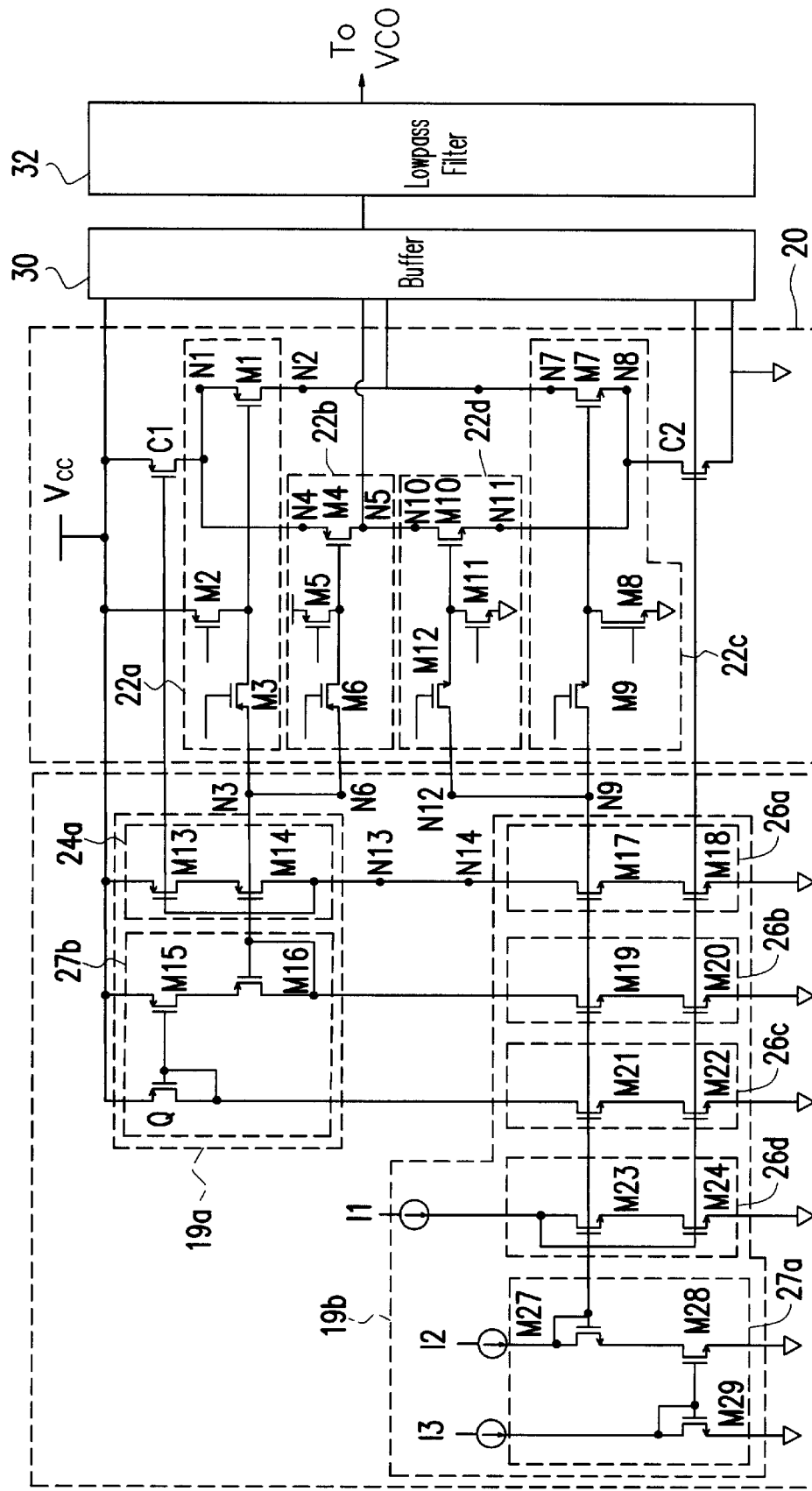
FIG. 3 is circuit diagram showing a low clock feed through charge pump circuit according to a preferred embodiment of the invention.

FIG. 3 is a detailed circuit diagram showing a low clock feed through charge pump circuit 20 according to a preferred embodiment of the invention. In the embodiment, a first pump transistor C1 is a PMOS transistor while a second pump transistor C2 is an NMOS transistor. Transistors M1–M6 used to form a first switch device 22a and a second switch device 22b all are PMOS transistors while transistors M7–M12 used to form a third switch device 22c and a fourth switch device 22d all are NMOS transistors. Transistors M13–M14 used to form a first cascode transistor circuit 24a and transistors M15, M16, Q used to form a bias circuit 27b all are PMOS transistors. Transistors M17–M29 forming a second cascode transistor circuit 26a–26d and a circuit 27a all are NMOS transistors. As an example described above, it is not used to limit the present invention.

As shown in FIG. 3, the low clock feed through charge circuit 20 includes a first pump transistor C1, a second pump transistor C2, a first switch device 22a, a second switch device 22b, a third switch device 22c and a fourth switch device 22d.

The source of the first pump transistor C1 is electrically coupled to a power supply Vcc while the source of the second pump transistor C2 is electrically coupled to ground, wherein the first pump transistor C1 and the second pump transistor C2 each serves as a current source.

Moreover, the first, second, third and fourth switch devices 22a–22d have first terminals N1, N4, N7, N10, second terminals N2, N5, N8, N11 and third terminals N3, N6, N9, N12, respectively. The first terminals N1, N4 of the first and second switch devices 22a, 22b are electrically coupled to the drain of the first pump transistor C1. The second terminals N8, N11 of the third and fourth switch devices 22c, 22d are electrically coupled to the drain of the second pump transistor C2. The second terminals N2, N5 of the first and second switch devices 22a, 22b are electrically coupled to the first terminals N7, N10 of the third and fourth switch devices 22c, 22d, respectively.

The third terminals N3, N6 of the first and second switch devices 22a, 22b are electrically coupled to each other while the third terminals N9, N12 of the third and fourth switch devices 22c, 22d are electrically coupled to each other. The transistors M1–M12 used to form the first, second, third and fourth switch devices 22a–22d all operate in a saturation region.

Furthermore, each of the first, second, third and fourth switch devices 22a–22d includes at least three transistors. As an example, the fist switch device 22a includes a transistor M1, a first control transistor M2 and a second control transistor M3, wherein the transistor M1 operates in the saturation region. The source of the transistor M1 is electrically coupled to the drain of the first pump transistor C1. The source of the first control transistor M2 is electrically coupled to the power supply Vcc while the drain of the first control transistor M2 is electrically coupled to the gate of the transistor M1. The second control transistor M3 is electrically coupled between the node N3 and the gate of the transistor M1. With such structure, when the transistor M1 is turned on, the gate thereof is lightly higher than Vcc/2, but not 0V as in the prior art. Therefore, the transistor M1 can operate in the saturation region, not in a linear region. Similarly, transistors M4, M7, M10 used to mainly form the switch devices 22b, 22c, 22d, respectively, all operate in the saturation region.

The transistors M2, M3 operate in the linear region. When the transistor M2 is turned on and the transistor M1 is turned off, the voltage of the gate of the transistor M1 becomes Vcc. When the transistor M2 is turned on, and the M3 transistor is turned off, the gate voltage of the transistor M1 is changed to Vcc, thereby turning off the transistor M1. Inversely, when the transistor M2 is turned off, and the transistor M3 is turned on, in this case, the gate voltage of the transistor M1 depends on the voltage of the node N3 while the voltage of the node N3 is determined by the bias circuits 27b. Therefore, the threshold voltage of the transistor M1 is equal to the voltage drop between the node N3 and Vcc, not between ground and Vcc. In addition, the turned-on transistor M1 has a less equivalent capacitance of the drain in the saturation region than in the linear region. Therefore, the transistor M1 has less charges stored on the drain when operating in the saturation region than in the linear region. When the transistor M1 is turned off, the effect of charge injection becomes unobvious. It is very helpful to stablize the voltage of a control oscillator circuit.

The cascode transistor circuit 24a and the circuit 27b includes transistors M13, M14 and transistors M15, M16, Q, respectively. The bias circuit 27b consists of at least two transistors M13, M14 electrically coupled in cascode for providing a constant current source to the first pump transistor C1 while the second cascode transistor circuit 24b consists of at least tow transistors M15, M16 electrically coupled in cascade. The gate of the transistor M14 is electrically coupled to the third terminal N3 of the first switch device 22a. The gate of the transistor M13 is electrically coupled to the gate of the first pump transistor C1. The drain of the transistor M14 is electrically coupled to the gate ofthe transistor M13. The gate ofthe transistor M16 is electrically coupled to the third terminal N3 of the first switch device 22a. The drain and the gate of the transistor M16 are electrically coupled to each other. The gate of the transistor M15 is electrically coupled to a load Q. The first cascode transistors 24a and the bias circuit 27b together form a current mirror for providing a constant current source to the first pump transistor C1.

Two wide-swing current mirrors 19a, 19b are used to provide a bias required by the low clock feed through charge pump circuit. Using the two wide-swing current mirror 19a, 19b can make a generated current more precise than the prior bias circuit and a required power supply more lower. The first wide-swing current mirror 19a mainly includes the first cascode transistor circuit 24a and the bias circuit 27b. The second wide-swing current mirror mainly includes the second cascode transistor circuit 26a, 26b, 26c, 26d and the bias circuit 27a.

The cascode transistor circuits 26a, 26b, 26c of the second wide-swing current mirror 19b are electrically coupled between the first wide-swing current mirror 19a and the bias circuit 27b and the ground. The cascode transistor circuits 26a, 26b, 26c, the second cascode transistor circuit 26d and the bias circuit 27a consist of transistors M17, M18, transistors M19, M20, transistors M21, M22, transistors M23, M24 and transistors M27,M28, M29, respectively. The gates of the transistors M17, M19, M21, M23 are electrically coupled to the third terminal of the third switch device 22c while the gates of the transistors M18, M20, M22, M24 are electrically coupled to the gate of the second pump transistor C2. The transistors M13, M14, M16, M17–M27, M29 of the first and second cascode transistor circuits 24a, 26d, 26a, 26b, 26c, 27a, 27b all operate in the saturation region.

Currents are mirrored into the cascode transistor circuits 26a, 26b, 26c from the second cascode transistor circuit 26d by the input current sources I1 of the charge pump 20, thereby making the first cascode transistor 24a have the same a current flow as the input current source I1. In view of the voltage of a node N5 output to the voltage control oscillator, the transistor M10 forms a cascode configuration together with the transistor C2 (current source). Therefore, a current flow mirrored into the transistor C2 is equal to the input current source I1. Similarly, since the transistor C1 and the transistor M4 together form a cascode configuration, the transistor C1 has the same current flow as the cascode transistor circuit 24a. Furthermore, since the first cascode transistor 24a has a current flow the same as the input current source I1, the first and second pump transistor C1, C2, serving as current sources, have the same current flow. Thus, cascode transistors can be used to reduce the difference of the current flow between the two charge pump current sources of the prior art.

Since the transistors M1, M4, M7, M10 of the charge pump circuit of the present invention all operate in the saturation region, it can efficiently get rid of charge injection. Additionally, in the low clock feed through charge pump circuit of the invention, the first and second pump transistors C1, C2 serving as current sources are precisely controlled at the same current flow, thereby making a signal output to the voltage control oscillator (VCO) much more stable. Thus, the output signal jitter of the voltage control oscillator is greatly lowered, making the frequency of the output signal of the phase locked loop circuit more stable.

As described above, since the transistors M1, M4, M7 and M10 all operate in the saturation region, charges can be accumulated on one side of the source when each of them is turned on. Furthermore, since the coupling capacitance on the drain of each turned-on transistor is less in the saturation region than in the linear region and the variation on the voltage of the gate is smaller, the number of charges stored on the drain is less. Therefore, when each transistor is turned on, the number of charges released from the drain is much less. As a result, the effect on the voltage of the output point is greatly reduced. Moreover, according to the present invention, since the transistors M1, M4, M7, M10 all operate in the saturation region, it is difficult to affect the current flows of the transistors C1, C2 by the variation of the voltage of the output point. In addition, the transistors M1, M4, M7, M10 form a cascode structure together with the cascode transistors C1, C2 serving as a current source, it makes a current flow provided by the transistors C1, C2 is almost the same as the current source I1.

In summary, a first feature of the invention is that the two current sources have the same current flow because the transistors used to form the cascode transistor circuits and the switch devices all operate in the saturation region. Moreover, the charge pump circuit can be allowed to operate at a lower operating voltage.

A second feature of the invention is that the transistor circuit serving as a switch device includes transistors operating in the saturation region and two transistors operating in the linear region for controlling the transistors, thereby eliminating the effect of the charge injection.

A third feature of the invention is that the voltage output from the charge pump circuit to the voltage control oscillator is much more stable. Therefore, the frequency jitter effect is greatly improved.

A fourth feature of the invention is that the voltage output from the phase locked loop circuit has a more stable frequency.

While the invention has been described by way of example and in terms of the preferred embodiment, it is to be understood that the invention is not limited to the disclosed embodiment. To the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A low clock feed through charge pump circuit comprising:

a first pump transistor having its own source electrically coupled to a power supply for serving as a current source;

a second pump transistor having its own source electrically coupled to ground for serving as a current source;

a first switch device having a first terminal electrically coupled to the drain of the first pump transistor, a second terminal, and a third terminal;

a second switch device having a first terminal electrically coupled to the drain of the first pump transistor, a second terminal, and a third terminal electrically coupled to the third terminal of the first switch device;

a third switch device having a first terminal electrically coupled to the second terminal of the first switch device, a second terminal electrically coupled to the drain of the second pump transistor, and a third terminal;

a fourth switch device having a first terminal electrically coupled to the second terminal of the second switch device, a second terminal electrically coupled to the drain of the second pump transistor, and a third terminal electrically coupled to the third terminal of the third switch device;

a first current mirror electrically coupled to the power supply, the gate of the first pump transistor, and the third terminal of the first switch device for providing a bias required by the low clock feed through charge pump circuit; and a second current mirror electrically coupled to the ground, the gate of the second pump transistor, and the third terminal of the fourth switch device.

2. The low clock feed through charge pump circuit as defined in claim 1, wherein the first and fourth switch devices each has:

a switch transistor electrically coupled to the first pump transistor and operating in a saturation region;

a first control transistor electrically coupled between the power supply and the gate of the switch transistor and operating at a linear region; and a second control transistor electrically coupled between the third terminal and the gate of the switch transistor and operating at a linear region.

3. The low clock feed through charge pump circuit as defined in claim 1, wherein the first wide-swing current mirror further comprises:

a first cascode transistor circuit electrically coupled between the power supply and ground, consisting of at least a first transistor and a second transistor, wherein the first transistor has its own gate electrically coupled to the third terminal of the first switch device, and the second transistor has its own gate electrically coupled to the gate of the first pump transistor and the drain of the first transistor; and a first current bias circuit electrically coupled to the first cascode transistor circuit.

4. The low clock feed through charge pump circuit as defined in claim 1, wherein the second wide-swing current mirror further comprises:

a second cascode transistor circuit consisting of a first transistor and a second transistor and having the gate of the first transistor electrically coupled to the third terminal of the fourth switch device, the gate of the second transistor electrically coupled to the gate of the second pump transistor and the drain of the first transistor and the drain of the first transistor electrically coupled to an input circuit source for providing an input current of the low clock feed through charge pump circuit;

a plurality of cascode transistor circuits electrically coupled among the first current bias current, the first cascode transistor circuit, the second cascode transistor circuit, the fourth switch device and the second pump transistor; and a second current bias circuit electrically coupled to the cascode transistor circuit.

5. The low clock feed through charge pump circuit as defined in claim 4, wherein the plurality of cascode transistor circuits consists of two cascode transistors.

6. The low clock feed through charge pump circuit as defined in claim 1, wherein the first pump transistor is a PMOS transistor.

7. The low clock feed through charge pump circuit as defined in claim 1, wherein the second pump transistor is an NMOS transistor.

8. The low clock feed through charge pump circuit as defined in claim 1, wherein the first and the second switch devices are PMOS transistors.

9. The low clock feed through charge pump circuit as defined in claim 1, wherein the third and the fourth switch devices are NMOS transistors.

10. The low clock feed through charge pump circuit as defined in claim 1, wherein the transistors of the first and the second cascode transistor circuits are PMOS and NMOS transistors, respectively.

11. A low clock feed through charge pump circuit comprising:

a first pump transistor having its own source electrically coupled to a power supply for serving as a current source;

a second pump transistor having its own source electrically coupled to ground for serving as a current source;

a first switch device having a first terminal electrically coupled to the drain of the first pump transistor, a second terminal, and a third terminal;

a second switch device having a first terminal electrically coupled to the drain of the first pump transistor, a second terminal, and a third terminal electrically coupled to the third terminal of the first switch device;

a third switch device having a first terminal electrically coupled to the second terminal of the first switch device, a second terminal electrically coupled to the drain of the second pump transistor, and a third terminal;

a fourth switch device having a first terminal electrically coupled to the second terminal of the second switch device, a second terminal electrically coupled to the drain of the second pump transistor, and a third terminal electrically coupled to the third terminal of the third switch device;

a first transistor having its gate and drain electrically coupled to the gate of the first pump transistor and the third terminal of the first switch device and its source electrically coupled to the power supply;

a second transistor having its gate electrically coupled to the gate of the second pump transistor and the third terminal of the third switch device, its source electrically coupled to the ground, and its drain electrically coupled to the drain of the first transistor; and a third transistor having its gate and drain electrically coupled to the gate of the second transistor, its drain electrically coupled to an input current source, and its source electrically coupled to the ground.

12. The low clock feed through charge pump circuit as claimed in claim 11, wherein the first and fourth switch devices each has:

a switch transistor electrically coupled to the first pump transistor and operating in a saturation region;

a first control transistor electrically coupled between the power supply and the gate of the switch transistor and operating at a linear region; and a second control transistor electrically coupled between the third terminal and the gate of the switch transistor and operating at a linear region.

13. The low clock feed through charge pump circuit as claimed in claim 11, wherein the first pump transistor is a PMOS transistor.

14. The low clock feed through charge pump circuit as claimed in claim 11, wherein the second pump transistor is an NMOS transistor.

15. The low clock feed through charge pump circuit as defined in claim 11, wherein the transistors forming the first and the second switch devices are PMOS transistors.

16. The low clock feed through charge pump circuit as defined in claim 11, wherein the transistors forming the third and the fourth switch devices are NMOS transistors.

17. A charge pump circuit applied in a phase locked loop circuit, comprising:

a first pump transistor having its own source electrically coupled to a power supply for serving as a current source;

a second pump transistor having its own source electrically coupled to ground for serving as a current source;

a first switch device having a first terminal electrically coupled to the drain of the first pump transistor, a second terminal, and a third terminal;

a second switch device having a first terminal electrically coupled to the drain of the first pump transistor, a second terminal, and a third terminal electrically coupled to the third terminal of the first switch device;

a third switch device having a first terminal electrically coupled to the second terminal of the first switch device, a second terminal electrically coupled to the drain of the second pump transistor, and a third terminal;

a fourth switch device having a first terminal electrically coupled to the second terminal of the second switch device, a second terminal electrically coupled to the drain of the second pump transistor, and a third terminal electrically coupled to the third terminal of the third switch device;

a first cascode transistor circuit electrically coupled between the power supply and ground and consisting of at least a first transistor and a second transistor, wherein the first transistor of the first cascode transistor circuit has its own gate electrically coupled to the third terminal of the first switch device, and the second transistor of the first cascode transistor circuit has its own gate electrically coupled to the gate of the first pump transistor, and the drain of the first transistor;

a second cascode transistor circuit consisting of a first transistor and a second transistor and having the gate of the first transistor of the second cascode transistor circuit electrically coupled to the third terminal of the fourth switch device, the gate of the second transistor of the second cascode transistor circuit electrically coupled to the gate of the second pump transistor, and the drain of the first transistor and the drain of the first transistor of the second cascode transistor circuit electrically coupled to an input circuit source for providing an input current of the low clock feed through charge pump circuit;

wherein the first and fourth switch devices each further has:

a switch transistor electrically coupled to the first pump transistor and operating in a saturation region;

a first control transistor electrically coupled between the power supply and the gate of the switch transistor, and operating at a linear region; and a second control transistor electrically coupled between the third terminal and the gate of the switch transistor, and operating at a linear region.

18. The charge pump circuit as claimed in claim 17, further comprises:

a first current supply transistor and a second current supply transistor circuit electrically coupled to a first cascode transistor circuit and a second cascode transistor circuit, respectively.

19. The charge pump circuit as claimed in claim 18, further comprises:

a plurality of bias transistor circuits electrically coupled among the first current supply transistor circuit, the first cascode transistor circuit, the second cascode transistor circuit, the fourth switch device and the second pump transistor.

20. The charge pump circuit as claimed in claim 19, wherein each bias transistor circuit consists of at least two cascode transistors.

21. The charge pump circuit as claimed in claim 17, wherein the first pump transistor is a PMOS transistor.

22. The charge pump circuit as claimed in claim 17, wherein the second pump transistor is an NMOS transistor.

23. The charge pump circuit as claimed in claim 17, wherein the transistors forming the first and second switch devices are PMOS transistors.

24. The charge pump circuit as claimed in claim 17, wherein the transistors forming the third and fourth switch devices are NMOS transistors.

25. The charge pump circuit as claimed in claim 17, wherein the transistors forming the first and second cascode transistor circuits are PMOS and NMOS transistors, respectively.

* * * * *